(12) United States Patent
Ikuta et al.

(10) Patent No.: US 8,946,863 B2
(45) Date of Patent: Feb. 3, 2015

(54) EPITAXIAL SUBSTRATE FOR ELECTRONIC DEVICE COMPRISING A HIGH RESISTANCE SINGLE CRYSTAL SUBSTRATE ON A LOW RESISTANCE SINGLE CRYSTAL SUBSTRATE, AND METHOD OF MANUFACTURING

(75) Inventors: Tetsuya Ikuta, Tokyo (JP); Daisuke Hino, Tokyo (JP); Ryo Sakamoto, Tokyo (JP); Tomohiko Shibata, Tokyo (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 0 days.

(21) Appl. No.: 13/388,804

(22) PCT Filed: Aug. 2, 2010

(86) PCT No.: PCT/JP2010/004871
§ 371 (c)(1),
(2), (4) Date: Feb. 23, 2012

(87) PCT Pub. No.: WO2011/016219
PCT Pub. Date: Feb. 10, 2011

(65) Prior Publication Data
US 2012/0153440 A1    Jun. 21, 2012

(30) Foreign Application Priority Data
Aug. 4, 2009  (JP) .................................. 2009-181669

(51) Int. Cl.
*H01L 29/66* (2006.01)
*H01L 29/778* (2006.01)
(Continued)

(52) U.S. Cl.
CPC .......... *H01L 29/7786* (2013.01); *H01L 21/187* (2013.01); *H01L 29/66462* (2013.01);
(Continued)

(58) Field of Classification Search
CPC ..... H01L 33/0079; H01L 33/12; H01L 33/13; H01L 29/66462
USPC .................... 257/592, 190, 15, 183, 189, 201, 257/E21.09, E21.097; 438/94, 455, 172
See application file for complete search history.

(56) References Cited

U.S. PATENT DOCUMENTS 5,897,362 A * 4/1999 Wallace ......................... 438/455
6,008,110 A * 12/1999 Samata et al. ................. 438/459
(Continued)

FOREIGN PATENT DOCUMENTS

JP  A-2001-196308   7/2001
JP  A-2002-299254   10/2002
(Continued)

OTHER PUBLICATIONS

Semiconductor Manufacturing Technology. Michael Quirk, Julian Serda. 2001. Prentice Hall Inc. pp. 87-88.*
(Continued)

*Primary Examiner* — Marcos D. Pizarro
*Assistant Examiner* — Cesar Lopez
(74) *Attorney, Agent, or Firm* — Oliff PLC

(57) ABSTRACT

An epitaxial substrate for electronic devices, in which current flows in a lateral direction and of which warpage configuration is properly controlled, and a method of producing the same. The epitaxial substrate for electronic devices is produced by forming a bonded substrate by bonding a low-resistance Si single crystal substrate and a high-resistance Si single crystal substrate together; forming a buffer as an insulating layer on a surface of the bonded substrate on the high-resistance Si single crystal substrate side; and producing an epitaxial substrate by epitaxially growing a plurality of III-nitride layers on the buffer to form a main laminate. The resistivity of the low-resistance Si single crystal substrate is 100 Ω·cm or less, and the resistivity of the high-resistance Si single crystal substrate is 1000 Ω·cm or more.

6 Claims, 5 Drawing Sheets

(a)

(b)

(51) Int. Cl.
  *H01L 21/18* (2006.01)
  *H01L 29/812* (2006.01)
  *H01L 21/02* (2006.01)

(52) U.S. Cl.
  CPC ........ *H01L29/66863* (2013.01); *H01L 29/812* (2013.01); *H01L 21/02381* (2013.01); *H01L 21/02488* (2013.01); *H01L 21/0254* (2013.01); *H01L 21/02658* (2013.01)
  USPC ............. 257/592; 257/15; 257/183; 257/190; 257/201; 257/E21.09; 438/94; 438/172; 438/455

(56) References Cited

U.S. PATENT DOCUMENTS

| | | | |
|---|---|---|---|
| 2004/0115937 | A1 | 6/2004 | Nagai et al. |
| 2004/0195562 | A1* | 10/2004 | Munns ............................. 257/1 |
| 2005/0285142 | A1* | 12/2005 | Piner et al. .................. 257/192 |
| 2007/0131160 | A1* | 6/2007 | Slack et al. .................. 117/106 |

FOREIGN PATENT DOCUMENTS

| | | |
|---|---|---|
| JP | A-2008-522447 | 6/2006 |
| JP | A-2008-262973 | 10/2008 |

OTHER PUBLICATIONS

Semiconductor Manufacturing Technology. Michael Quirk, Julian Serda. 2001. pp. 76, 87-88. Prentice Hall Inc.*

International Search Report issued in International Patent Application No. PCT/JP2010/004871 dated Aug. 24, 2010.

Mar. 4, 2014 Office Action issued in Japanese Patent Application No. 2011-525781 (w/English Translation).

* cited by examiner (a)     (b)

(a)

(b)

(c)

(d)

(a)

(b)

(a)

(b)

EPITAXIAL SUBSTRATE FOR ELECTRONIC DEVICE COMPRISING A HIGH RESISTANCE SINGLE CRYSTAL SUBSTRATE ON A LOW RESISTANCE SINGLE CRYSTAL SUBSTRATE, AND METHOD OF MANUFACTURING

TECHNICAL FIELD

The present invention relates to an epitaxial substrate for electronic devices and a method of producing the same. The present invention particularly relates to an epitaxial substrate for HEMTs, in which current flows in a lateral direction, and a method of producing the same.

RELATED ART

In recent years, as speed required of IC devices and the like have increased, HEMTs (High electron mobility transistors) have been widely used as high-speed FETs (Field effect transistors). Such a field effect transistor is generally formed, as schematically illustrated in FIG. 1, for example by stacking a channel layer 22 and an electron supply layer 23 on an insulating substrate 21 and then providing a surface of the electron supply layer 23 with a source electrode 24, a drain electrode 25, and a gate electrode 26. When the device is operated, electrons move through the source electrode 24, the electron supply layer 23, the channel layer 22, the electron supply layer 23, and the drain electrode 25 in this order. In the device, a lateral direction is a main current flow direction. This movement of electrons in the lateral direction, i.e. the current flow direction, is controlled by the voltage applied to the gate electrode 26. In HEMTs, electrons generated at a joint interface between the electron supply layer 23 and the channel layer 22 which have band gaps different from each other can move significantly fast, as compared with electrons in normal semiconductors.

An epitaxial substrate formed by epitaxially growing a Group III nitride laminate on a semiconductor substrate is generally used as an epitaxial substrate for FETs. Examples of such a semiconductor substrate as described above include a Si substrate having a specific resistance exceeding $1 \times 10^2$ Ω·cm for use to decrease substrate loss that is parasitic loss caused by concuctive substrate which deteriorates device performances, as disclosed in JP 2008-522447 W.

It has been conventionally considered that use of a Si substrate having relatively high specific resistance is preferable, as described above. How ever, it has been known that, when layers are epitaxially grown on a Si substrate having a predetermined resistance and the layer has the different specific resistance from the predetermined resistance, mismatch of lattice constants generally occurs between the Si substrate and the epitaxially-grown layers, whereby warp(s) is generated to alleviate strains. When patterns are formed on such an epitaxial substrate with warpage, the rear surface of the epitaxial substrate is generally vacuum adsorbed to level the epitaxial substrate surface. However, in the case where the configuration of the above warpage does not seem uniform in the cross section of the substrate, the vacuum adsorption cannot be performed favorably, which has been a problem. In particular, high-resistance Si substrates having low impurity content are inferior in rigidity and deformable, so that the substrates are easily warped with complicated configuration, which has been another problem.

PRIOR ART DOCUMENT

Patent Document

[Patent Document 1] JP 2008-522447 W

DISCLOSURE OF THE INVENTION

Problems to be Solved by the Invention

In order to solve the above problems, an object of the present invention is to provide an epitaxial substrate for electronic devices, in which current flows in a lateral direction and of which warpage configuration is properly controlled, and to provide a method of producing the epitaxial substrate.

Means for Solving the Problems

In order to achieve the above object, the present invention primarily includes the following constituent features.

(1) A method of producing an epitaxial substrate for electronic devices, comprising the steps of: forming a bonded substrate by bonding a low-resistance Si single crystal substrate and a high-resistance Si single crystal substrate together; forming a buffer as an insulating layer on a surface of the bonded substrate on the high-resistance Si single crystal substrate side; and producing an epitaxial substrate by epitaxially growing a plurality of III-nitride layers on the buffer to form a main laminate, wherein a lateral direction is a current flow direction in the epitaxial substrate, the resistivity of the low-resistance Si single crystal substrate is 100 Ω·cm or less, and the resistivity of the high-resistance Si single crystal substrate is 1000 Ω·cm or more.

(2) The method of producing an epitaxial substrate for electronic devices according to (1) above, wherein the step of forming the bonded substrate is performed by bonding the low-resistance Si single crystal substrate and the high-resistance Si single crystal substrate with a Si oxide film.

(3) A method of producing an epitaxial substrate for electronic devices, comprising the steps of: epitaxially growing a high-resistance Si single crystal layer on a low-resistance Si single crystal substrate; forming a buffer as an insulating layer on the high-resistance Si single crystal layer; and producing an epitaxial substrate by epitaxially growing a plurality of III-nitride layers on the buffer to form a main laminate, wherein a lateral direction is a current flow direction in the epitaxial substrate, the resistivity of the low-resistance Si single crystal substrate is 100 Ω·cm or less, and the resistivity of the high-resistance Si single crystal layer is 1000 Ω·cm or more.

(4) An epitaxial substrate for electronic devices, comprising: a substrate having a low-resistance Si single crystal substrate and a high-resistance Si single crystal substrate arranged above the low-resistance Si single crystal substrate; a buffer as an insulating layer, arranged on the high-resistance Si single crystal substrate; and a main laminate formed by epitaxially growing a plurality of III-nitride layers on the buffer, wherein a lateral direction is a current flow direction in the epitaxial substrate, the resistivity of the low-resistance Si single crystal substrate is 100 Ω·cm or less, and the resistivity of the high-resistance Si single crystal substrate is 1000 Ω·cm or more.

(5) The epitaxial substrate for electronic devices according to (4) above, wherein a Si oxide film is provided between the low-resistance Si single crystal substrate and the high-resistance Si single crystal substrate.

(6) The epitaxial substrate for electronic devices according to (4) or (5) above, wherein a thickness of the high-resistance Si single crystal substrate is 10 μm or more.

(7) The epitaxial substrate for electronic devices according to any one of (4) to (6) above, wherein a thickness of the low-resistance Si single crystal substrate is 10 times or more a thickness of the high-resistance Si single crystal substrate.

(8) The epitaxial substrate for electronic devices according to any one of (4) to (7) above, wherein the buffer has a superlattice structure or a graded composition structure.

(9) The epitaxial substrate for electronic devices according to any one of (4) to (8) above, wherein the buffer has a C concentration of $1\times10^{18}$ atoms/cm$^3$ or more.

Effect of the Invention

The present invention can provide an epitaxial substrate for electronic devices, in which current flows in a lateral direction and of which warpage configuration is properly controlled by means of a substrate having a low-resistance Si single crystal substrate and a high-resistance Si single crystal substrate arranged above this low-resistance Si single crystal substrate. The present invention can further provide a method of producing such an epitaxial substrate.

BRIEF DESCRIPTION OF DRAWINGS

FIG. 3(a) illustrates a state where the substrate is warped uniformly in one direction and FIG. 3(b) illustrates a state where the substrate is warped non-uniformly in both directions;

MODES FOR CARRYING OUT THE INVENTION

Figure 2:
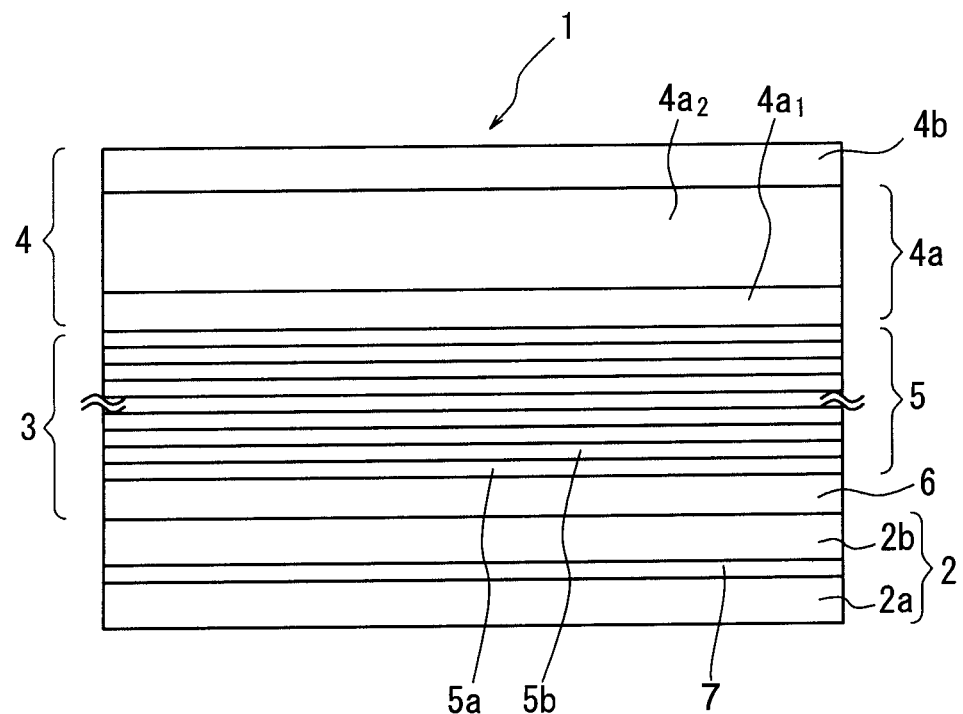
FIG. 2 is a schematic cross-sectional view of an epitaxial substrate for electronic devices according to the present invention.

Next, embodiments of an epitaxial substrate for electronic devices according to the present invention will be described with reference to the drawings. FIG. 2 schematically shows a cross-sectional structure of an epitaxial substrate for electronic devices according to the present invention. Note that the epitaxial substrate in FIG. 2 is enlarged in the thickness direction for the sake of explanation.

An epitaxial substrate 1 for electronic devices according to the present invention includes, as shown in FIG. 2, a substrate 2 having a low-resistance Si single crystal substrate 2a and a high-resistance Si single crystal substrate 2b arranged above this low-resistance Si single crystal substrate 2a, a buffer 3 as an insulating layer arranged on the high-resistance Si single crystal substrate 2b, and a main laminate 4 formed by epitaxially growing a plurality of III-nitride layers on this buffer 3. The resistivity of the low-resistance Si single crystal substrate 2a is 100 Ω·cm or less and the resistivity of the high-resistance Si single crystal substrate 2b is 1000 Ω·cm or more.

Thus, the configuration of warpage can be made to be a uniform configuration. Consequently, vacuum adsorption can be performed favorably, and as a result, exposure failure can be inhibited, which is a remarkable effect.

Figure 1:
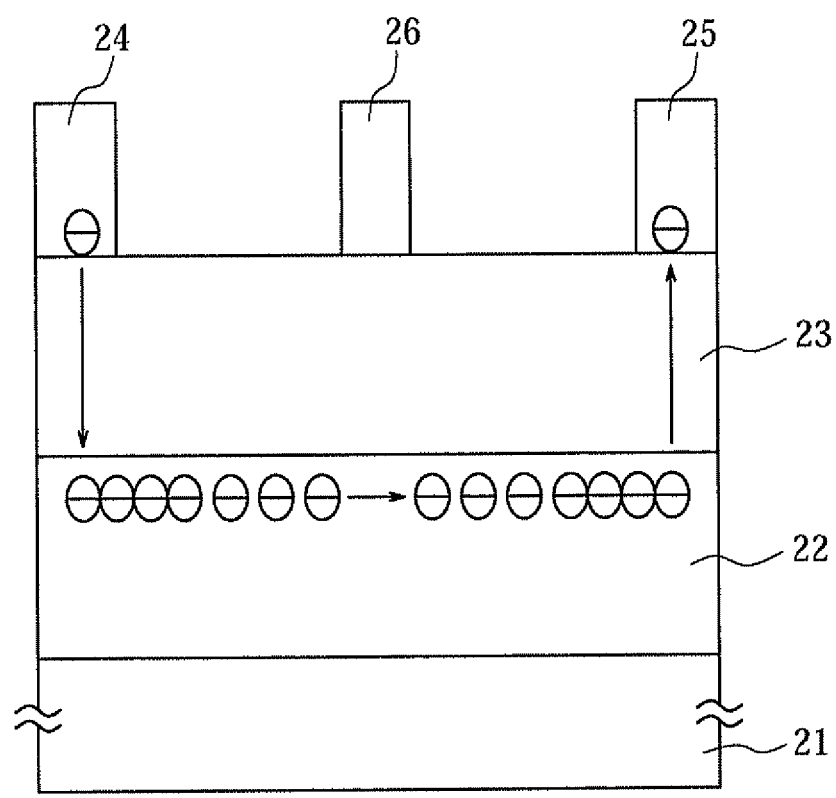
FIG. 1 is a schematic cross-sectional view illustrating a typical field effect transistor.

Now, "a lateral direction is a main current flow direction" refers to a state where, as illustrated in FIG. 1, electric current flows from the source electrode 24 to the drain electrode 25, mainly in the width direction of the laminate. This state is different from, for example, the state where electric current flows mainly in the vertical direction, that is, the direction of the thickness of the laminate as in a structure in which a semiconductor is sandwiched between a pair of electrodes.

Further, in the present invention, when a cross section of a substrate is seen, a case where the above-mentioned warpage configuration is uniform corresponds to the state where the substrate is warped uniformly in one direction as shown in FIG. 3(a). Meanwhile, a case where the warpage configuration is non-uniform corresponds to the state where the substrate is warped non-uniformly in both directions, for example in an "M" shape as shown in FIG. 3(b).

With reference to FIG. 2, the substrate 2 is formed either by bonding the low-resistance Si single crystal substrate 2a and the high-resistance Si single crystal substrate 2b together, or by epitaxially growing a high-resistance Si single crystal layer 2b on the low-resistance Si single crystal substrate 2a. Although not shown in FIG. 2, in a case where the low-resistance Si single crystal substrate 2a and the high-resistance Si single crystal substrate 2b are bonded together, a Si oxide film 7 may be formed on the entire surfaces of these substrates 2a and 2b before they are bonded together, such that the Si oxide film 7 is provided therebetween.

The resistivity of the low-resistance Si single crystal substrate 2a is 100 Ω·cm or less. The lower limit of the resistivity is not limited in particular, but is preferably 0.001 Ω·cm or more, which can be industrially obtained by actual doping, but not limited thereto. The resistivity of this low-resistance Si single crystal substrate 2a is adjusted by adding a p-type impurity element or an n-type impurity element. Examples of the p-type and n-type impurity elements include for example, boron and phosphorus, respectively, and the substrate doped with an impurity element becomes harder than a highly pure substrate without being doped with impurities. In particular, boron is preferably used as the impurity element since it is the lightest element among these impurities and has high binding energy, and accordingly is effective in increasing the hardness of a substrate. Further, in addition to such impurities which influence electrical conductivity, C, H, O, Ge, N, or the like may be mixed in at the same time. The hardness of the substrate can be expected to be further improved depending on the type of the impurities mixed in. Such a substrate is preferably produced by the CZ method.

The resistivity of the high-resistance Si single crystal substrate 2b is 1000 Ω·cm or more. The upper limit of the resistivity is not limited in particular, but is preferably 20000 Ω·cm or less, which can be industrially obtained by actual purification. As the resistivity is increased, an epitaxial substrate for electronic devices which is excellent in high frequency characteristics can be produced. Note that the crystal faces of the principal planes of the low-resistance Si and high-resistance Si are not necessarily the same. For example, (110) face may be used for the low-resistance Si substrate, while (111) face which is suitable for epitaxial growth may be used for the high-resistance Si substrate.

When the substrate formed by bonding the low-resistance Si single crystal substrate 2a and the high-resistance Si single crystal substrate 2b together is used as the substrate 2, the high-resistance Si single crystal substrate 2b is preferably produced by the FZ method by which Si crystals are purified easily. On the other hand, when the substrate 2 is formed by epitaxially growing the high-resistance Si single crystal layer (substrate) 2b on the low-resistance Si single crystal substrate 2a, the high-resistance Si single crystal layer 2b is grown under the conditions where contamination with impurities is suppressed as much as possible using a device configuration meeting the conditions. The high-resistance Si single crystal layer 2b is preferably produced by means of thermal CVD since a thick single crystal film needs to be grown.

The present invention makes it possible to achieve both high frequency characteristics of the substrate and hardness sufficient for uniform warpage of the substrate by means of the above-described substrate 2 having the low-resistance Si single crystal substrate 2a and the high-resistance Si single crystal substrate 2b. The low-resistance Si single crystal substrate 2a and the high-resistance Si single crystal layer (substrate) 2b are composed of the same material; thus, warpage due to thermal stress can be expected to be suppressed.

On this occasion, the high-resistance Si single crystal substrate or layer 2b preferably has a thickness of 10 μm or more. This is because when the thickness is less than 10 μm, carriers in the low-resistance Si single crystal substrate 2a inductively or capacitively interact with carriers in a conductive layer of an electronic device layer, which would cause a loss in operation of the device with a high frequency of 1 GHz or more.

Further, a thickness of the low-resistance Si single crystal substrate 2a is not limited in particular as long as the shape as the substrate is maintained; however, it is preferably in the range of 100 μm to 2000 μm. When the thickness is less than 100 μm, the low-resistance Si single crystal substrate 2a may be broken when being handled. On the other hand, when the thickness is more than 2000 μm, it may be difficult to handle the substrate because of its heaviness. Further, the low-resistance Si single crystal substrate should compensate the rigidity of the high-resistance Si single crystal substrate; therefore, it preferably has a thickness ten times or more the thickness of the high-resistance Si single crystal substrate. Note that in some cases, the low-resistance Si single crystal substrate is removed to improve heat dissipation in device production.

After that, the buffer 3 as an insulating layer is formed on the high-resistance Si single crystal substrate 2b. The buffer 3 preferably has a superlattice structure or a graded composition structure. The superlattice structure refers to a structure in which first layers 5a and second layers 5b are stacked in a cyclic manner as shown in FIG. 2. The structure may include layers other than the first layers 5a and the second layers 5b (for example, a compositional transition layer). Meanwhile, the graded composition structure refers to a structure in which the content of certain III element is graded in the film thickness direction.

Further, the buffer 3 preferably includes an initial growth layer 6 in contact with the Si single crystal substrate 2 and a superlattice laminate 5 having a superlattice laminate structure on the initial growth layer 6 as shown in FIG. 2. The initial growth layer 6 is formed of, for example, an AlN material, and when the initial growth layer 6 is formed of AlN, the reaction with the high-resistance Si single crystal substrate 2b can be suppressed, which makes it possible to improve vertical breakdown voltage. The aim of this is to suppress degradation of vertical breakdown voltage due to defects generated by the reaction of Ga and In with Si in the substrate when the initial growth layer 6 is formed of III-nitride materials containing Ga and In, which induce through-hole defects in the epitaxial film. Note that the AlN materials here may contain a minute amount of impurities of 1% or less, for example, impurities such as Ga and In above, or Si, H, O, C, B, Mg, As, or P. Further, the buffer 3 preferably has a C concentration of $1 \times 10^{18}$ atoms/cm$^3$ or more to improve vertical breakdown voltage.

A plurality of III-nitride layers are epitaxially grown on the buffer 3 to form a main laminate 4, thereby producing an epitaxial substrate. The epitaxial substrate 1 for electronic devices is preferably used for HEMTs. The main laminate 4 of the epitaxial substrate 1 for electronic devices shown in FIG. 2 may have a channel layer 4a made of a $B_{a1}Al_{b1}G_{c1}In_{d1}N$ ($0 \leq a_1 \leq 1$, $0 \leq b_1 \leq 1$, $0 \leq c_1 \leq 1$, $0 \leq d_1 \leq 1$, $a_1+b_1+c_1+d_1=1$) material and an electron supply layer 4b made of a $B_{a2}Al_{b2}Ga_{c2}In_{d2}N$ ($0 \leq a_2 \leq 1$, $0 \leq b_2 1$, $0 \leq c_2 \leq 1$, $0 \leq d_2 \leq 1$, $a_2+b_2+c_2+d_2=1$) material, which has a larger band gap than the channel layer 4a. On this occasion, each layer can be made of a single or a plurality of compositions. In particular, to prevent alloy scattering and to lower resistivity at the current flowing portion, at least a portion $4a_2$ of the channel layer 4a, which is in contact with the electron supply layer 4b is preferably made of a GaN material.

Figure 3:
FIGS. 3(a) and 3(b) each schematically show a warpage configuration seen in a cross section of a substrate.
Figure 3:
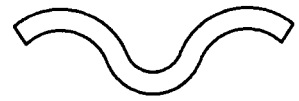

FIGS. 1 to 3 merely show examples of representative embodiments, and the present invention is not limited to these embodiments. For example, interlayers may be inserted or another superlattice layer may be interposed between each layer, or the compositions of the layers may be graded as long as the effects of the present invention are not adversely affected.

EXAMPLE

Example 1

A 4-inch (111) high-resistance Si single crystal substrate (thickness: 40 μm, FZ method, without intentional doping, resistivity: $6 \times 10^3$ Ω·cm) and a 4-inch (111) low-resistance Si single crystal substrate (thickness: 560 μm, CZ method, doped with B, resistivity: 15 Ω·cm) were bonded together to prepare a bonded substrate. This high-resistance Si single crystal substrate was formed by forming a Si oxide film on both surfaces of a substrate by previous thermal oxidization, and then removing the Si oxide film on one side, thus leaving the Si oxide film (thickness: 1 μm) on the other side. The above bonding of the substrates was performed with the remaining Si oxide film interposed therebetween.

Figure 4:
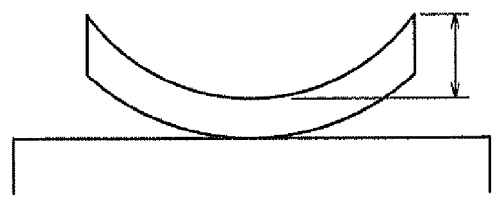
FIGS. 4(a) to 4(d) are schematic views for illustrating SORI and LTV of the present invention.
Figure 4:
Figure 4:
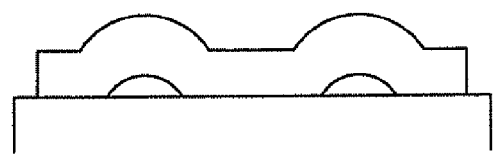
Figure 4:
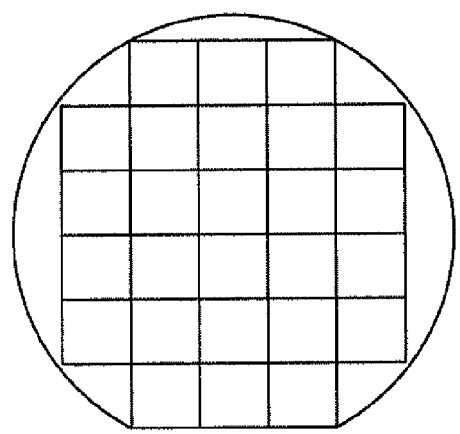

Warpage of the bonded substrate was evaluated with "SORI", "LTV" and "the maximum value of LTV". Here, SORI refers to the difference between the maximum value and the minimum value of the height of the substrate surface without being vacuum adsorbed, shown in FIG. 4(a): Meanwhile, LTV (Local thickness variation) refers to the difference between the maximum value and the minimum value among the heights of a plurality of sites (10 mm×10 mm) defined as shown in FIG. 4(d) in a state where the substrate is vacuum adsorbed as shown in FIG. 4(b). When the vacuum adsorption is not sufficient, for example, as shown in FIG. 4(c), gaps are formed between the substrate and an adsorption stage, which increases LTV by the height of the gaps. Exposure is performed on each site in a focused manner; therefore, high LTV will cause focus error, which leads to exposure failure. Therefore, a low maximum value of LTV means less tendency to exposure failure. Note that the measurements of SORI and LTV were each performed under the condition of the edge exclusion (the peripheral portion which is not subjected to measurement): 3 mm.

The SORI, LTV, and the maximum value of LTV of the above bonded substrate were measured using a substrate processing precision measuring apparatus (FT-900 manufactured by NIDEK CO., LTD.); SORI was 4.0 μm and the maximum value of LTV was 1.5 μm.

Subsequently, on a surface of the above bonded substrate on the high-resistance Si single crystal substrate side, an initial growth layer (AlN material, thickness: 100 nm) and a superlattice laminate (AlN, thickness: 4 nm and $Al_{0.15}Ga_{0.85}N$, thickness: 25 nm, total 75 layers) were grown to form a buffer. On this superlattice laminate, a channel layer (GaN material, thickness: 0.75 μm) and an electron supply layer ($Al_{0.27}Ga_{0.73}N$ material, thickness: 18 nm) were epitaxially grown to form a main laminate having a HEMT structure. Thus, a sample was obtained. The C concentration of the superlattice laminate was $2.0 \times 10^{18}$ atoms/cm$^3$. Further a portion of the channel layer on the electron supply layer side had a C concentration of $0.8 \times 10^{16}$ atoms/cm$^3$ to $1.5 \times 10^{16}$ atoms/cm$^3$. The growth temperature and growth pressure of each layer are shown in Table 1. MOCVD was used as a growth method. TMA (trimethylaluminium) and TMG (trimethylgallium) were used as Group III materials, and ammonia was used as a Group V material. Hydrogen gad and nitrogen gas were used as carrier gases. The deposition temperature here means a temperature of the substrate itself, measured using a radiation thermometer during the growth.

TABLE 1

|  | Growth pressure (kPa) | Growth temperature (° C.) |
| --- | --- | --- |
| Initial growth layer 6 | 10 | 1005 |
| Superlattice laminate 5 | 10 | 1005 |
| Channel layer on the buffer side $4a_1$ | 10 | 1015 |
| Channel layer on the electron supply layer side $4a_2$ | 100 | 1025 |
| Electron supply layer 4b | 10 | 1025 |

Figure 5:
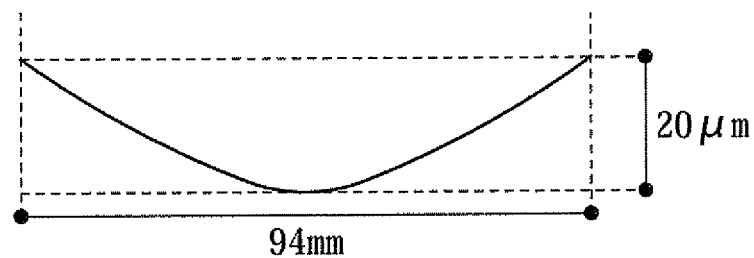
FIGS. 5(a) and 5(b) are schematic cross-sectional views each illustrating the warpage configuration seen in the cross section of an epitaxial substrate in accordance with the present invention.
Figure 5:
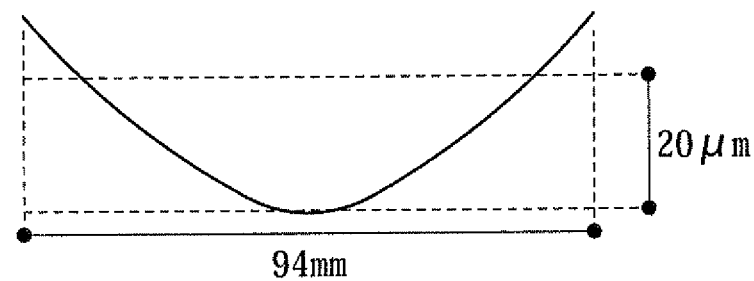

The warpage configuration of the formed epitaxial substrate viewed in its cross section is shown in FIG. 5(a). FIG. 5(a) illustrates a surface configuration in the cross section of the substrate through the orientation flat center and the substrate center. As the SORI and LTV of this epitaxial substrate were measured, the SORI was 19.7 μm and the maximum value of LTV was 1.5 μm.

Example 2

On a surface of the bonded substrate (SORI: 4.2 μm, maximum value of LTV: 1.4 μm) formed in a similar manner to Example 1 on the high-resistance Si single crystal substrate side, an initial growth layer (AlN material, thickness: 100 nm), a $Al_{0.6}Ga_{0.4}N$ layer (thickness: 0.5 μm), and a $Al_{0.3}Ga_{0.7}N$ layer (thickness: 0.3 μm) were sequentially grown to form a buffer. On this graded composition buffer layer, a channel layer 4a (GaN material, thickness: 0.75 μm) and an electron supply layer ($Al_{0.27}Ga_{0.73}N$ material, thickness: 18 nm) were epitaxially grown to form a main laminate having a HEMT structure. Thus, a sample was obtained. The C concentration of the AlGaN was $2.0 \times 10^{18}$ atoms/cm$^3$. Further, a portion of the channel layer on the electron supply layer side had a C concentration of $0.8 \times 10^{16}$ atoms/cm$^3$ to $1.5 \times 10^{16}$ atoms/cm$^3$. The growth temperature and growth pressure of each layer are shown in Table 2. MOCVD was used as a growth method. TMA (trimethylaluminium) and TMG (trimethylgallium) were used as Group III materials, and ammonia was used as a Group V material. Hydrogen gas and nitrogen gas were used as carrier gases. The deposition temperature here means the temperature of the substrate itself, measured using a radiation thermometer during the growth.

TABLE 2

|  | Growth pressure (kPa) | Growth temperature (° C.) |
| --- | --- | --- |
| Initial growth layer 6 | 10 | 1005 |
| $Al_{0.6}Ga_{0.4}N$ layer | 10 | 1005 |
| $Al_{0.3}Ga_{0.7}N$ layer | 10 | 1005 |
| Channel layer on the buffer side $4a_1$ | 10 | 1015 |
| Channel layer on the electron supply layer side $4a_2$ | 100 | 1025 |
| Electron supply layer 4b | 10 | 1025 |

The warpage configuration of the formed epitaxial substrate seen in its cross section is shown in FIG. 5(b). FIG. 5(b) illustrates a surface configuration in the cross section of the substrate through the orientation flat center and the substrate center. As the SORI and LTV of this epitaxial substrate were measured, the SORI was 30.1 μm and the maximum value of LTV was 1.5 μm.

Comparative Example 1

Figure 6:
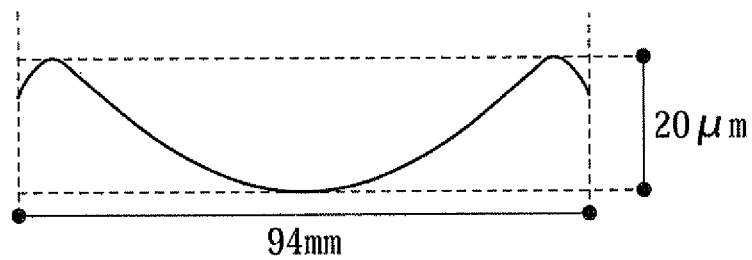
FIGS. 6(a) and 6(b) are schematic cross-sectional views each illustrating the warpage configuration seen in the cross section of an epitaxial substrate of a comparative example.
Figure 6:
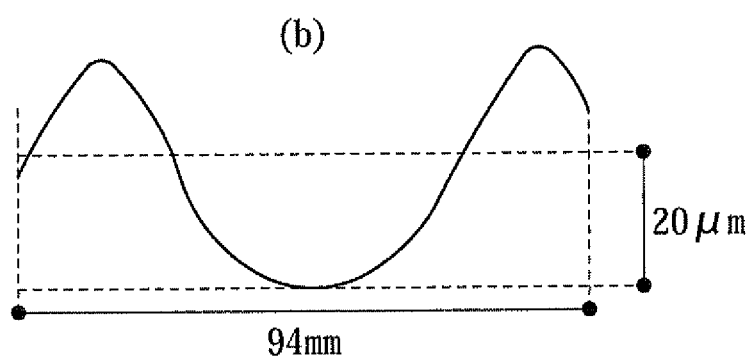

A structure similar to the structure in Example 1 was formed on a 4-inch (111) Si single crystal substrate (thickness: 600 μm, CZ method, doped with B, resistivity: $6 \times 10^3$ Ω·cm, SORI: 3.1 μm, the maximum value of LTV: 0.9 μm) under the same conditions as Example 1. Thus, a sample was obtained. The warpage configuration of the formed epitaxial substrate seen in its cross section is shown in FIG. 6(a). FIG. 6(a) illustrates a surface configuration in the cross section of the substrate through the orientation flat center and the substrate center. As the SORI and LTV of this epitaxial substrate were measured, the SORI was 21.8 μm and the maximum value of LTV was 3.0 μm.

Comparative Example 2

A structure similar to the structure in Example 2 was formed under the same conditions as Example 2 on a Si single crystal substrate similar to Comparative Example 1 (SORI: 3.0 μm, the maximum value of LTV: 0.9 μm). Thus, a sample was obtained. The warpage configuration of the formed epitaxial substrate seen in its cross section is shown in FIG. 6(b). FIG. 6(b) illustrates a surface configuration in the cross section of the substrate through the orientation flat center and the substrate center. As the SORI and LTV of this epitaxial substrate were measured, the SORI was 36.9 μm and the maximum value of LTV was 3.5 μm.

(Evaluation) The epitaxial substrates of Comparative Examples 1 and 2 were concave at the center as shown in FIGS. 6(a) and (b); however, regions close to the substrate peripheries were convex, and the substrate perimeters hung down by approximately 5 μm and approximately 10 μm, respectively to form M shapes as a whole. Further, many sites with more than 2 μm thickness unevenness were in the peripheral portion of the substrates. This is considered to be due to non-uniform adsorption of the rear surfaces. On the other hand, the epitaxial substrates of Examples 1 and 2 according to the present invention were concave and uniformly shaped as a whole as shown in FIGS. 5(a) and (b). Moreover, as shown in Table 3, as to Examples 1 and 2, the maximum value of LTV after the epitaxial growth did not increase as compared with the maximum value of LTV before the epitaxial growth.

TABLE 3

|  | SORI (μm) | | The Maximum value of LTV (μm) | |
| --- | --- | --- | --- | --- |
|  | Bonded substrate | Epitaxial substrate | Bonded substrate | Epitaxial substrate |
| Example 1 | 4 | 19.7 | 1.5 | 1.5 |
| Example 2 | 4.2 | 30.1 | 1.4 | 1.5 |
| Comparative Example 1 | 3.1 | 21.8 | 0.9 | 3.0 |
| Comparative Example 2 | 3.1 | 36.9 | 0.9 | 3.5 |

INDUSTRIAL APPLICABILITY

According to the present invention, a substrate having a low-resistance Si single crystal substrate and a high-resistance Si single crystal substrate arranged above this low-resistance Si single crystal substrate is used, so that an epitaxial substrate for electronic devices in which lateral direction is a current flow direction and of which warpage configuration is properly controlled can be provided, and a method of producing the same can also be provided.

EXPLANATION OF REFERENCE NUMERALS

1: Epitaxial substrate for electron devices
2: Substrate
2a: Low-resistance Si single crystal substrate
2b: High-resistance Si single crystal substrate
3: Buffer
4: Main laminate
4a: Channel layer
4b: Electron supply layer
5: Superlattice laminate
5a: First layers
5b: Second layers
6: Initial growth layer
21: Insulating substrate
22: Channel layer
23: Electron supply layer
24: Source electrode
25: Drain electrode
26: Gate electrode

The invention claimed is:

1. A method of producing an epitaxial substrate for electronic devices, comprising the steps of:
    forming a bonded substrate by bonding a low-resistance Si single crystal substrate and a high-resistance Si single crystal substrate together;
    forming a buffer as an insulating layer on a surface of the bonded substrate on the high-resistance Si single crystal substrate side; and
    producing an epitaxial substrate by epitaxially growing a plurality of III-nitride layers on the buffer to form a main laminate,
    wherein a lateral direction is a current flow direction in the epitaxial substrate,
    the resistivity of the low-resistance Si single crystal substrate is 100 Ω·cm or less,
    the resistivity of the high-resistance Si single crystal substrate is 1000 Ω·cm or more,
    an impurity element of the low-resistance Si single crystal substrate is boron, and
    the high-resistance Si single crystal substrate has a thickness of more than 10 μm, and a thickness of the low-resistance Si single crystal substrate is ten times or more than the thickness of the high-resistance Si single crystal substrate.

2. The method of producing an epitaxial substrate for electronic devices according to claim 1, wherein the step of forming the bonded substrate is performed by bonding the low-resistance Si single crystal substrate and the high-resistance Si single crystal substrate with a Si oxide film.

3. The method of producing an epitaxial substrate for electronic devices according to claim 1, wherein the buffer layer comprises cyclically stacked first and second layers.

4. An epitaxial substrate for electronic devices, comprising:
    a substrate having a low-resistance Si single crystal substrate, a high-resistance Si single crystal substrate arranged above the low-resistance Si single crystal substrate, and a Si oxide film provided between the low-resistance Si single crystal substrate and the high-resistance Si single crystal substrate;
    a buffer as an insulating layer, arranged on the high-resistance Si single crystal substrate; and
    a main laminate formed by epitaxially growing a plurality of III-nitride layers on the buffer,
    wherein a lateral direction is a current flow direction in the epitaxial substrate,
    the resistivity of the low-resistance Si single crystal substrate is 100 Ω·cm or less,
    the resistivity of the high-resistance Si single crystal substrate is 1000 Ω·cm or more, and
    an impurity element of the low-resistance Si single crystal substrate is boron, and
    the high-resistance Si single crystal substrate has a thickness of more than 10 μm, and a thickness of the low-resistance Si single crystal substrate is ten times or more than the thickness of the high-resistance Si single crystal substrate.

5. The epitaxial substrate for electronic devices according to claim 4, wherein the buffer has a superlattice structure or a graded composition structure.

6. The epitaxial substrate for electronic devices according to claim 4, wherein the buffer has a C concentration of $1 \times 10^{18}$ atoms/cm$^3$ or more.

* * * * *